United States Patent
Liu et al.

(10) Patent No.: US 8,713,386 B2
(45) Date of Patent: Apr. 29, 2014

(54) DEVICE FOR INCREASING CHIP TESTING EFFICIENCY AND METHOD THEREOF

(75) Inventors: Shi-Huei Liu, Hsinchu County (TW); Sen-Fu Hong, Tainan (TW); Ho-Yin Chen, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 167 days.

(21) Appl. No.: 13/344,580

(22) Filed: Jan. 5, 2012

(65) Prior Publication Data
US 2012/0215960 A1 Aug. 23, 2012

(30) Foreign Application Priority Data
Feb. 18, 2011 (TW) .............................. 100105390 A

(51) Int. Cl.
*G11C 29/00* (2006.01)
(52) U.S. Cl.
USPC ............................ 714/722; 714/726; 714/744
(58) Field of Classification Search
USPC .......... 714/722, 726, 744, 741, 733, 738, 724
See application file for complete search history.

(56) References Cited

U.S. PATENT DOCUMENTS 7,213,187 B2 * 5/2007 Lin ............................... 714/738
7,941,722 B2 * 5/2011 Cussonneau et al. ......... 714/742

* cited by examiner

*Primary Examiner* — Fritz Alphonse
(74) *Attorney, Agent, or Firm* — Winston Hsu; Scott Margo

(57) ABSTRACT

A device for increasing chip testing efficiency includes a pattern generator, a reading unit, a logic operation circuit, and a judgment unit. The pattern generator is used for writing a logic voltage to each bank of a memory chip. The reading unit is used for reading logic voltages stored in all memory cells of each bank. The logic operation circuit is used for executing a first logic operation on the logic voltages stored in all memory cells of each bank to generate a plurality of first logic operation results corresponding to each bank, and executing a second logic operation on the plurality of first logic operation results to generate a second logic operation result corresponding to the memory chip. The judgment unit determines whether the memory chip passes the test according to the second logic operation result.

21 Claims, 9 Drawing Sheets

| BK0 | BK1 | BK2 | BK3 |
|---|---|---|---|
| "D0" | – | "D0" | – |
| – | "D1" | – | "D1" |

FIG. 1A PRIOR ART

| BK0 | BK1 | BK2 | BK3 |
|---|---|---|---|
| "D0" | – | – | "D0" |
| – | "D1" | "D1" | – |

FIG. 1B PRIOR ART

| BK0 | BK1 | BK2 | BK3 |
|---|---|---|---|
| "D0" | "D0" | "D0" | "D0" |

FIG. 1C PRIOR ART

| BK0 | BK1 | BK2 | BK3 |
|---|---|---|---|
| "D0" | — | "D0B" | — |
| — | "D1" | — | "D1" |

FIG. 3A

| BK0 | BK1 | BK2 | BK3 |
|---|---|---|---|
| "D0" | — | "D0" | — |
| — | "D1" | — | "D1B" |

FIG. 3B

| BK0 | BK1 | BK2 | BK3 |
|---|---|---|---|
| "D0" | — | — | "D0B" |
| — | "D1" | "D1" | — |

FIG. 3C

| BK0 | BK1 | BK2 | BK3 |
|---|---|---|---|
| "D0" | — | — | "D0" |
| — | "D1" | "D1B" | — |

FIG. 3D

| BK0 | BK1 | BK2 | BK3 |
|---|---|---|---|
| "D0" | — | "D0B" | — |
| — | "D1" | — | "D1B" |

FIG. 3E

| BK0 | BK1 | BK2 | BK3 |
|---|---|---|---|
| "D0" | — | — | "D0B" |
| — | "D1" | "D1B" | — |

FIG. 3F

| BK0 | BK1 | BK2 | BK3 |
|---|---|---|---|
| "D0" | "D0B" | "D0" | "D0" |

FIG. 3G

| BK0 | BK1 | BK2 | BK3 |
|---|---|---|---|
| "D0" | "D0" | "D0B" | "D0" |

FIG. 3H

| BK0 | BK1 | BK2 | BK3 |
|---|---|---|---|
| "D0" | "D0" | "D0" | "D0B" |

FIG. 3I

| BK0 | BK1 | BK2 | BK3 |
|-----|-----|-----|-----|
| "D0" | "D0B" | "D0B" | "D0" |

FIG. 3J

| BK0 | BK1 | BK2 | BK3 |
|-----|-----|-----|-----|
| "D0" | "D0" | "D0B" | "D0B" |

FIG. 3K

| BK0 | BK1 | BK2 | BK3 |
|-----|-----|-----|-----|
| "D0" | "D0B" | "D0B" | "D0B" |

FIG. 3L

DEVICE FOR INCREASING CHIP TESTING EFFICIENCY AND METHOD THEREOF

BACKGROUND OF THE INVENTION

1. Field of the Invention

The present invention is related to a device for increasing chip testing efficiency and method thereof, and particularly to a device and method thereof that utilize an address compression method to increase chip testing efficiency.

2. Description of the Prior Art

Please refer to FIG. 1A, FIG. 1B, and FIG. 1C. FIG. 1A, FIG. 1B, and FIG. 1C are diagrams illustrating a test for a memory chip according to the prior art. As shown in FIG. 1A, a logic voltage "D0" is written to banks BK0, BK2 and a logic voltage "D1" is written to banks BK1, BK3 simultaneously. Then, logic voltages stored in the banks BK0, BK2 and logic voltages stored in the banks BK1, BK3 are read simultaneously, and the logic voltages stored in the banks BK0, BK2 are compared with the logic voltage "D0", and the logic voltages stored in the banks BK1, BK3 are compared with the logic voltage "D1" to determine whether the memory chip is passed. Similarly, as shown in FIG. 1B, the logic voltage "D0" is written to the banks BK0, BK3 and the logic voltage "D1" is written to the banks BK1, BK2 simultaneously. Then, logic voltages stored in the banks BK0, BK3 and logic voltages stored in the banks BK1, BK2 are read simultaneously, and the logic voltages stored in the banks BK0, BK3 are compared with the logic voltage "D0", and the logic voltages stored in the banks BK1, BK2 are compared with the logic voltage "D1" to determine whether the memory chip is passed. In addition, as shown in FIG. 1C, the logic voltage "D0" is written to the banks BK0, BK1, BK2, and BK3 simultaneously. Then, logic voltages stored in the banks BK0, BK1, BK2, and BK3 are read simultaneously, and the logic voltages stored in the banks BK0, BK1, BK2, and BK3 are compared with the logic voltage "D0" to determine whether the memory chip is passed.

Though the prior arts in FIG. 1A, FIG. 1B, and FIG. 1C can reduce time for testing the memory chip, only two test patterns can be inputted in FIG. 1A and FIG. 1B and only one test pattern can be inputted in FIG. 1C. Therefore, the prior arts in FIG. 1A, FIG. 1B, and FIG. 1C have lower diversity, resulting in insufficient test coverage.

SUMMARY OF THE INVENTION

An embodiment provides a method of increasing chip testing efficiency. The method includes utilizing a pattern generator to write a first logic voltage to at least one first bank of a plurality of first banks of a memory chip, and to write a logic voltage opposite to the first logic voltage to other first banks simultaneously; utilizing the pattern generator to write a second logic voltage to a plurality of second banks of the memory chip simultaneously; reading logic voltages stored in all memory cells of each bank of the memory chip; executing a first logic operation on the logic voltages stored in all the memory cells of each bank to generate a plurality of first logic operation results corresponding to each bank; executing a second logic operation on the plurality of first logic operation results to generate a second logic operation result corresponding to the memory chip.

Another embodiment provides a method of increasing chip testing efficiency. The method includes utilizing a pattern generator to write a first logic voltage to at least one first bank of a plurality of first banks of a memory chip, and to write a logic voltage opposite to the first logic voltage to other first banks simultaneously; utilizing the pattern generator to write a second logic voltage to at least one second bank of a plurality of second banks of the memory chip, and to write a logic voltage opposite to the second logic voltage to other second banks simultaneously; reading logic voltages stored in all memory cells of each bank of the memory chip; executing a first logic operation on the logic voltages stored in all the memory cells of each bank to generate a plurality of first logic operation results corresponding to each bank; executing a second logic operation on the plurality of first logic operation results to generate a second logic operation result corresponding to the memory chip.

Another embodiment provides a method of increasing chip testing efficiency. The method includes utilizing a pattern generator to write a first logic voltage to at least one bank of a plurality of banks of a memory chip, and to write a logic voltage opposite to the first logic voltage to other banks of the plurality of banks simultaneously; reading logic voltages stored in all memory cells of each bank of the memory chip; executing a first logic operation on the logic voltages stored in all the memory cells of each bank to generate a plurality of first logic operation results corresponding to each bank; executing a second logic operation on the plurality of first logic operation results to generate a second logic operation result corresponding to the memory chip.

Another embodiment provides a device for increasing chip testing efficiency. The device includes a pattern generator, a reading unit, a logic operation circuit, and a judgment unit. The pattern generator is used for writing a logic voltage to each bank of a memory chip. The reading unit is used for reading logic voltages stored in all memory cells of each bank of the memory chip. The logic operation circuit is used for executing a first logic operation on the logic voltages stored in all the memory cells of each bank to generate a plurality of first logic operation results corresponding to each bank, and a second logic operation on the plurality of first logic operation results to generate a second logic operation result corresponding to the memory chip. The judgment unit is used for determining whether the memory chip is passed according to the second logic operation result.

The present invention provides a device for increasing chip testing efficiency and method thereof. The device and the method not only reduce time for testing a memory chip but also provide a variety of test patterns for the memory chip. Therefore, compared to the prior art, diversity and test coverage of test patterns provided by the present invention are higher.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1A, FIG. 1B, and FIG. 1C are diagrams illustrating a test for a memory chip according to the prior art.

FIG. 3A, FIG. 3B, FIG. 3C, FIG. 3D, FIG. 3E, FIG. 3F, FIG. 3G, FIG. 3H, FIG. 3I, FIG. 3J, FIG. 3K, and FIG. 3L are diagrams illustrating the pattern generator writing logic voltages to the 4 banks of the memory chip.

DETAILED DESCRIPTION

Figure 2:
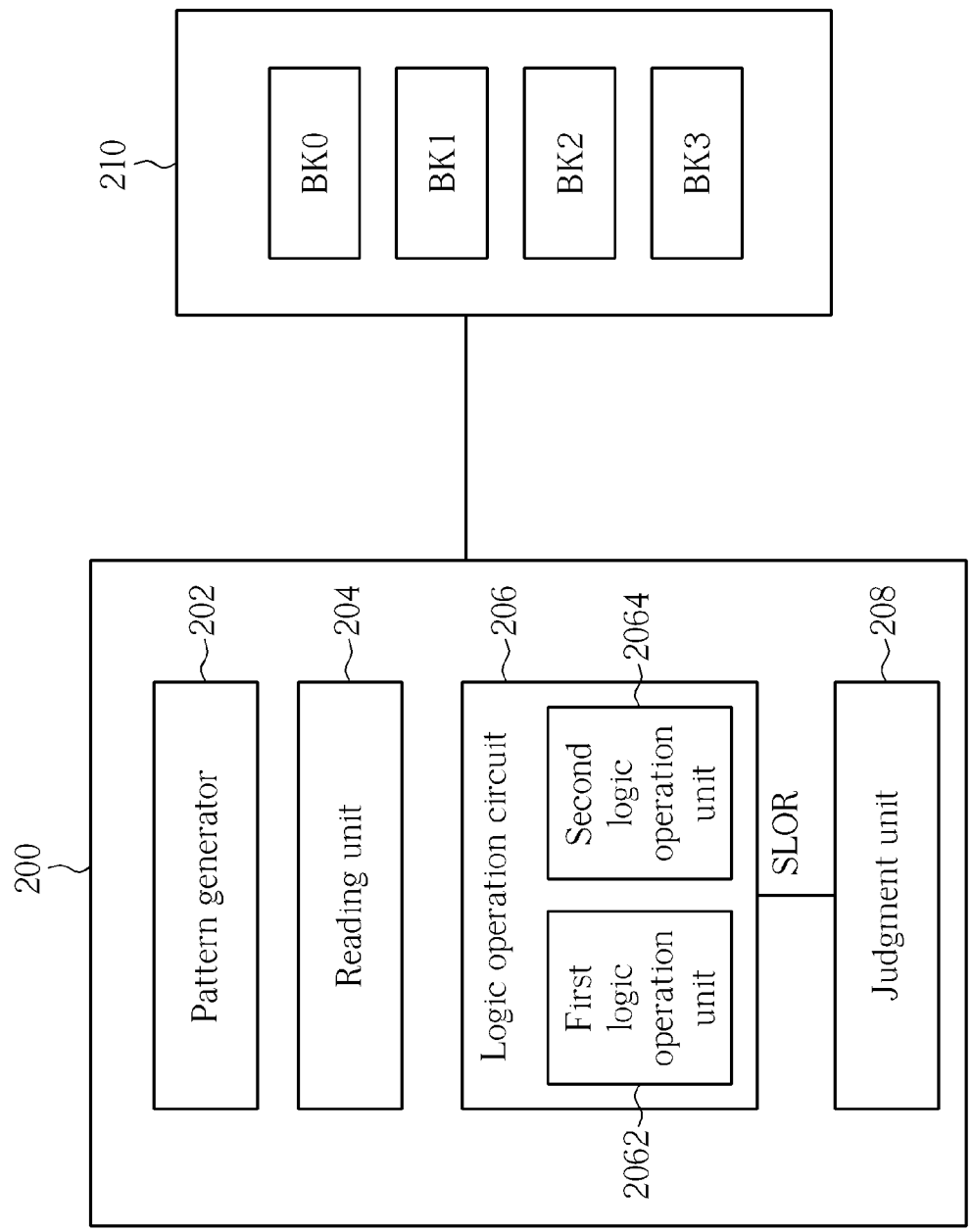
FIG. 2 is a diagram illustrating a device for increasing chip testing efficiency according to an embodiment.

Please refer to FIG. 2. FIG. 2 is a diagram illustrating a device 200 for increasing chip testing efficiency according to an embodiment. The device 200 includes a pattern generator 202, a reading unit 204, a logic operation circuit 206, and a judgment unit 208. The pattern generator 202 is used for writing a logic voltage to each bank of 4 banks of a memory chip 210, where the pattern generator 202 utilizes a solid pattern, a checkerboard pattern, a row bar pattern, or a column bar pattern to write a logic voltage to each bank of the 4 banks of the memory chip 210. But, the present is not limited to the memory chip 210 only having 4 banks. The reading unit 204 is used for reading logic voltages stored in all memory cells of each bank of the memory chip 210. The logic operation circuit 206 includes a first logic operation unit 2062 and a second logic operation unit 2064. The first logic operation unit 2062 is used for executing a first logic operation on logic voltages stored in all the memory cells of each bank read by the reading unit 204 to generate a first logic operation result corresponding to each bank. The second logic operation unit 2064 is used for executing a second logic operation on a plurality of first logic operation results to generate a second logic operation result SLOR, where the first logic operation and the second logic operation are exclusive-OR logic operations. The judgment unit 208 is used for determining whether the memory chip 210 is passed according to the second logic operation result SLOR.

Please refer to FIG. 3A, FIG. 3B, FIG. 3C, FIG. 3D, FIG. 3E, FIG. 3F, FIG. 3G, FIG. 3H, FIG. 3I, FIG. 3J, FIG. 3K, and FIG. 3L. FIG. 3A, FIG. 3B, FIG. 3C, FIG. 3D, FIG. 3E, FIG. 3F, FIG. 3G, FIG. 3H, FIG. 3I, FIG. 3J, FIG. 3K, and FIG. 3L are diagrams illustrating the pattern generator 202 writing logic voltages to the 4 banks BK0-BK3 of the memory chip 210. As shown in FIG. 3A, the pattern generator 202 writes a logic voltage "D0" in the bank BK0 and a logic voltage "D0B" opposite to the logic voltage "D0" in the bank BK2 simultaneously, and writes a logic voltage "D1" in the banks BK1, BK3 simultaneously. That is to say, a logic voltage stored in a memory cell (e.g. x-coordinate is zero and y-coordinate is zero) of the bank BK0 is opposite to a logic voltage stored in a memory cell at the same address (e.g. x-coordinate is zero and y-coordinate is zero) of the bank BK2, and a logic voltage stored in a memory cell (e.g. x-coordinate is zero and y-coordinate is zero) of the bank BK1 is the same as a logic voltage stored in a memory cell at the same address (e.g. x-coordinate is zero and y-coordinate is zero) of the bank BK3. Similarly, as shown in FIG. 3B, the pattern generator 202 writes the logic voltage "D1" to the bank BK1 and a logic voltage "D1B" opposite to the logic voltage "D1" to the bank BK3 simultaneously, and writes the logic voltage "D0" to the banks BK0, BK2 simultaneously. As shown in FIG. 3C, the pattern generator 202 writes the logic voltage "D0" to the bank BK0 and the logic voltage "D0B" opposite to the logic voltage "D0" to the bank BK3 simultaneously, and writes the logic voltage "D1" to the banks BK1, BK2 simultaneously. As shown in FIG. 3D, the pattern generator 202 writes the logic voltage "D1" to the bank BK1 and the logic voltage "D1B" opposite to the logic voltage "D1" to the bank BK2 simultaneously, and writes the logic voltage "D0" to the banks BK0, BK3 simultaneously. As shown in FIG. 3E, the pattern generator 202 writes the logic voltage "D0" to the bank BK0 and the logic voltage "D0B" opposite to the logic voltage "D0" to the bank BK2 simultaneously, and writes the logic voltage "D1" to the bank BK1 and the logic voltage "D1B" opposite to the logic voltage "D1" to the bank BK3 simultaneously. As shown in FIG. 3F, the pattern generator 202 writes the logic voltage "D0" to the bank BK0 and the logic voltage "D0B" opposite to the logic voltage "D0" to the bank BK3 simultaneously, and writes the logic voltage "D1" to the bank BK1 and the logic voltage "D1B" opposite to the logic voltage "D1" to the bank BK2 simultaneously. As shown in FIG. 3G, FIG. 3H, FIG. 3I, FIG. 3J, FIG. 3K, and FIG. 3L, the pattern generator 202 writes the logic voltage "D0" to at least one bank of the 4 banks BK0-BK3 and the logic voltage "D0B" opposite to the logic voltage "D0" to other banks of the 4 banks BK0-BK3 simultaneously. In addition, the present invention is not limited to the above mentioned patterns of the pattern generator 202 writing logic voltages to the 4 banks BK0-BK3 of the memory chip 210.

Figure 4:
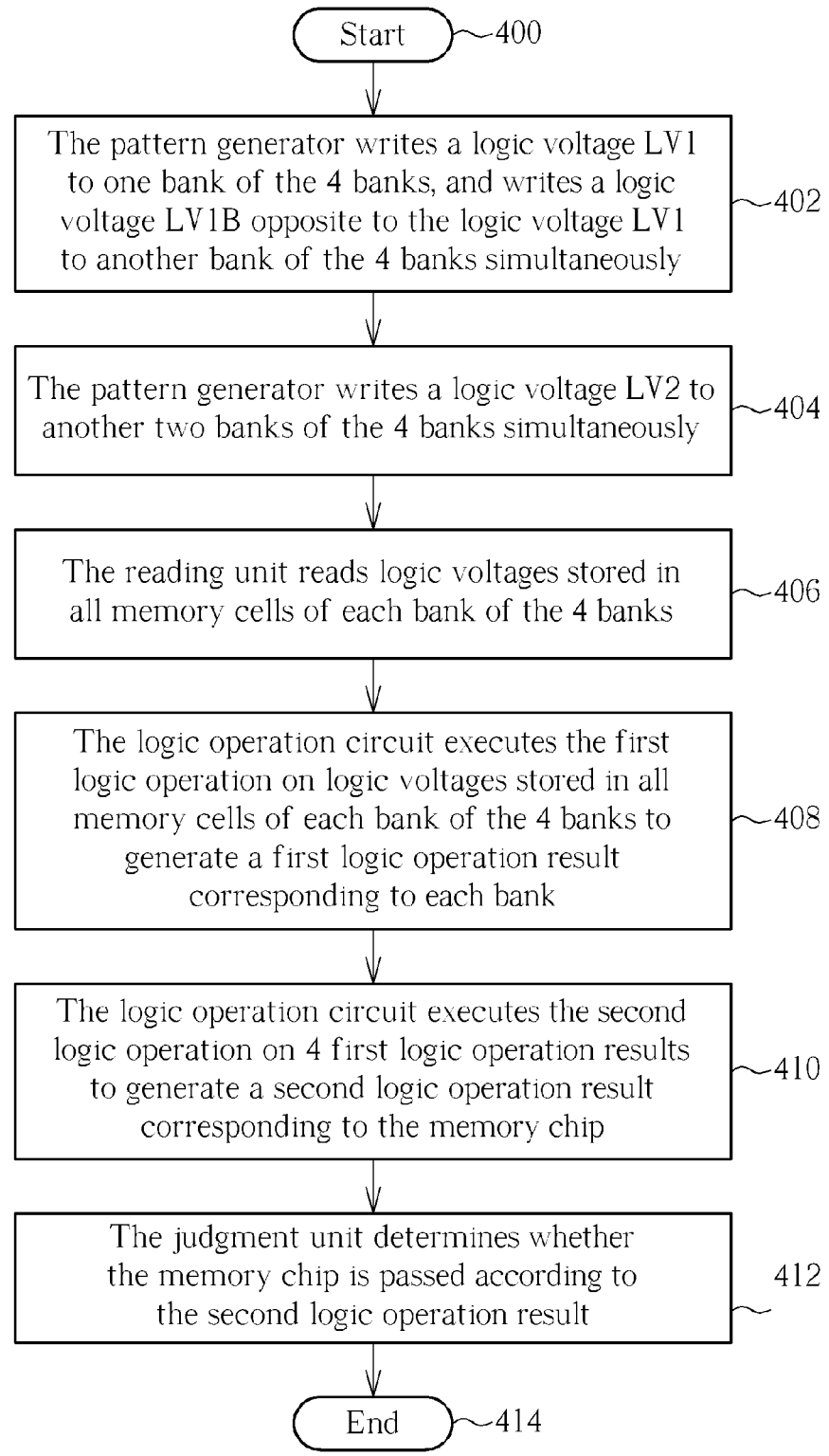
FIG. 4 is a flowchart illustrating a method of increasing chip testing efficiency according to another embodiment.

Please refer to FIG. 4. FIG. 4 is a flowchart illustrating a method of increasing chip testing efficiency according to another embodiment. The method in FIG. 4 is illustrated using the device 200 in FIG. 2. Detailed steps are as follows:

Step 400: Start.

Step 402: The pattern generator 202 writes a logic voltage LV1 to one bank of the 4 banks BK0-BK3, and writes a logic voltage LV1B opposite to the logic voltage LV1 to another bank of the 4 banks BK0-BK3 simultaneously.

Step 404: The pattern generator 202 writes a logic voltage LV2 to another two banks of the 4 banks BK0-BK3 simultaneously.

Step 406: The reading unit 204 reads logic voltages stored in all memory cells of each bank of the 4 banks BK0-BK3.

Step 408: The logic operation circuit 206 executes the first logic operation on logic voltages stored in all memory cells of each bank of the 4 banks BK0-BK3 to generate a first logic operation result corresponding to each bank.

Step 410: The logic operation circuit 206 executes the second logic operation on 4 first logic operation results to generate a second logic operation result SLOR corresponding to the memory chip 210.

Step 412: The judgment unit 208 determines whether the memory chip 210 is passed according to the second logic operation result SLOR.

Step 414: End.

In Step 402 and Step 404, the pattern generator 202 utilizes the solid pattern, the checkerboard pattern, the row bar pattern, or the column bar pattern to write the logic voltage LV1 and the logic voltage LV1B simultaneously to two banks of the 4 banks BK0-BK3, respectively, and to write the logic voltage LV2 simultaneously to the other two banks of the 4 banks BK0-BK3. Therefore, as shown in FIG. 3A, the pattern generator 202 utilizes the solid pattern, the checkerboard pattern, the row bar pattern, or the column bar pattern to write the logic voltage LV1 ("D0") and the logic voltage LV1B ("D0B") simultaneously to the banks BK0 and BK2, respectively, and to write the logic voltage LV2 ("D1") to banks BK1 and BK3 simultaneously. In addition, subsequent operational principles of FIG. 3B, FIG. 3C, and FIG. 3D are the same as those of FIG. 3A, so further description thereof is omitted for simplicity. In Step 408, the first logic operation unit 2062 of the logic operation circuit 206 first executes the first logic operation on logic voltages stored in all memory cells of each bank of the 4 banks BK0-BK3 to generate a first logic operation result corresponding to each bank, where the first logic operation is the exclusive-OR logic operation. In Step 410, the second logic operation unit 2064 of the logic operation circuit 206 executes the second logic operation on the 4 first logic operation results to generate the second logic operation result SLOR corresponding to the memory chip 210, where the second logic operation is the exclusive-OR logic operation. In Step 412, the judgment unit 208 can determine whether the memory chip 210 is passed according to the second logic operation result SLOR.

Figure 5:
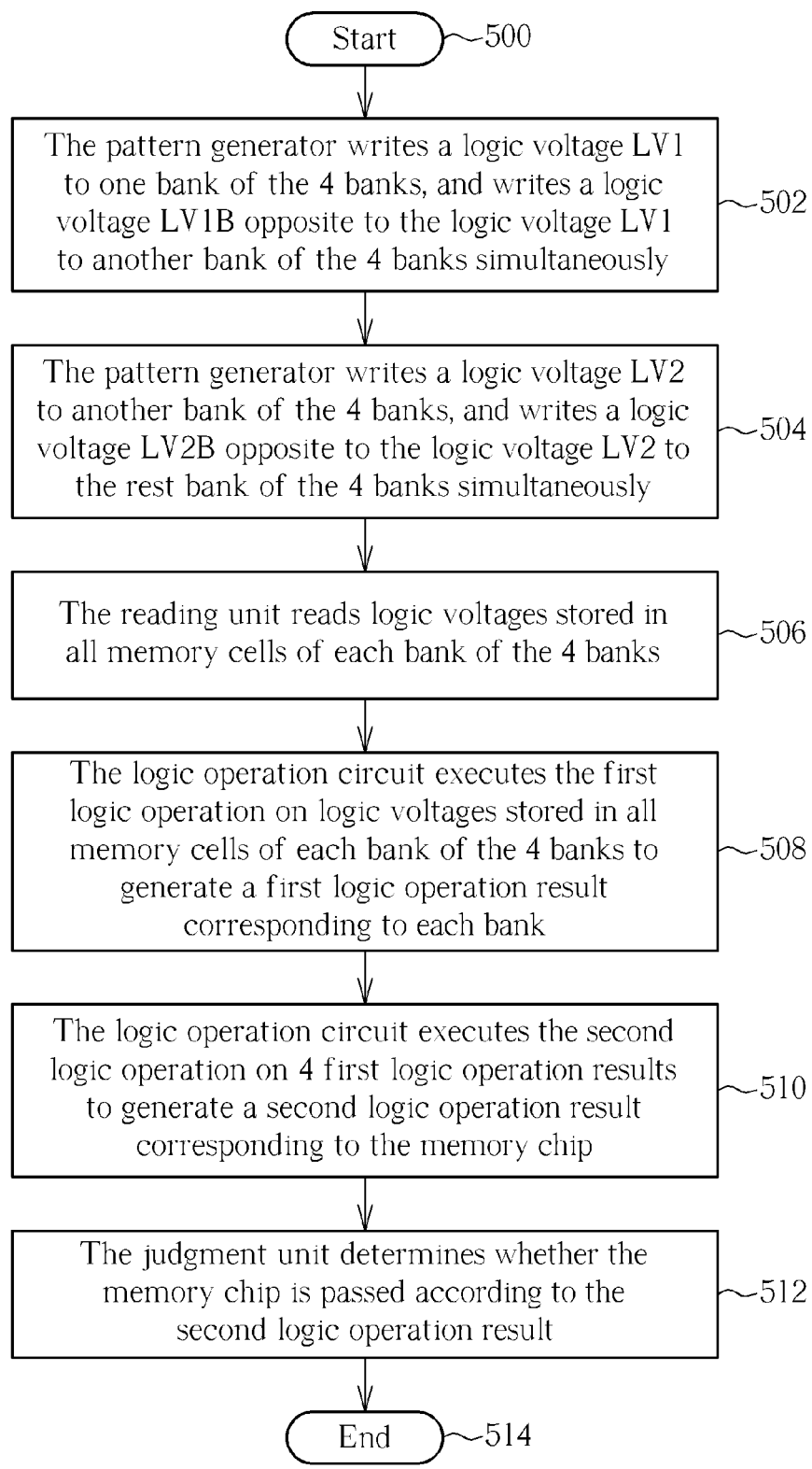
FIG. 5 is a flowchart illustrating a method of increasing chip testing efficiency according to another embodiment.

Please refer to FIG. 5. FIG. 5 is a flowchart illustrating a method of increasing chip testing efficiency according to another embodiment. The method in FIG. 5 is illustrated using the device 200 in FIG. 2. Detailed steps are as follows:

Step 500: Start.

Step 502: The pattern generator 202 writes a logic voltage LV1 to one bank of the 4 banks BK0-BK3, and writes a logic voltage LV1B opposite to the logic voltage LV1 to another bank of the 4 banks BK0-BK3 simultaneously.

Step 504: The pattern generator 202 writes a logic voltage LV2 to another bank of the 4 banks BK0-BK3, and writes a logic voltage LV2B opposite to the logic voltage LV2 to the rest bank of the 4 banks BK0-BK3 simultaneously.

Step 506: The reading unit 204 reads logic voltages stored in all memory cells of each bank of the 4 banks BK0-BK3.

Step 508: The logic operation circuit 206 executes the first logic operation on logic voltages stored in all memory cells of each bank of the 4 banks BK0-BK3 to generate a first logic operation result corresponding to each bank.

Step 510: The logic operation circuit 206 executes the second logic operation on 4 first logic operation results to generate a second logic operation result SLOR corresponding to the memory chip 210.

Step 512: The judgment unit 208 determines whether the memory chip 210 is passed according to the second logic operation result SLOR.

Step 514: End.

In Step 502 and Step 504, the pattern generator 202 utilizes the solid pattern, the checkerboard pattern, the row bar pattern, or the column bar pattern to write the logic voltage LV1 and the logic voltage LV1B simultaneously to two banks of the 4 banks BK0-BK3, respectively, and to write the logic voltage LV2 and the logic voltage LV2B simultaneously to other two banks of the 4 banks BK0-BK3, respectively. Therefore, as shown in FIG. 3E, the pattern generator 202 utilizes the solid pattern, the checkerboard pattern, the row bar pattern, or the column bar pattern to write the logic voltage LV1 ("D0") and the logic voltage LV1B ("D0B") simultaneously to the banks BK0 and BK2, respectively, and to write the logic voltage LV2 ("D1") and the logic voltage LV2B ("D1B") simultaneously to the banks BK1 and BK3, respectively. In addition, subsequent operational principles of FIG. 3F are the same as those of FIG. 3E, so further description thereof is omitted for simplicity.

Figure 6:
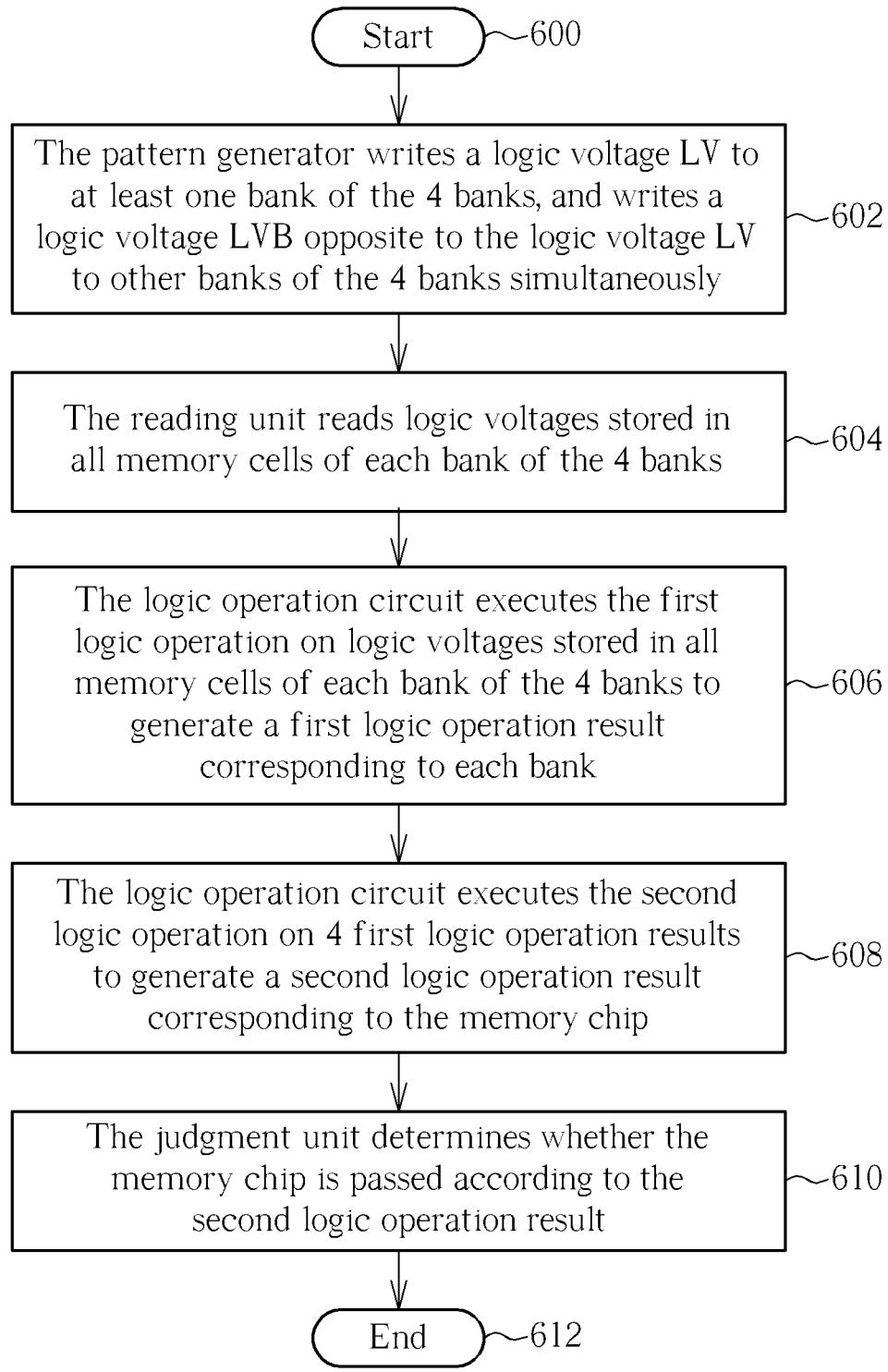
FIG. 6 is a flowchart illustrating a method of increasing chip testing efficiency according to another embodiment.

Please refer to FIG. 6. FIG. 6 is a flowchart illustrating a method of increasing chip testing efficiency according to another embodiment. The method in FIG. 6 is illustrated using the device 200 in FIG. 2. Detailed steps are as follows:

Step 600: Start.

Step 602: The pattern generator 202 writes a logic voltage LV to at least one bank of the 4 banks BK0-BK3, and writes a logic voltage LVB opposite to the logic voltage LV to other banks of the 4 banks BK0-BK3 simultaneously.

Step 604: The reading unit 204 reads logic voltages stored in all memory cells of each bank of the 4 banks BK0-BK3.

Step 606: The logic operation circuit 206 executes the first logic operation on logic voltages stored in all memory cells of each bank of the 4 banks BK0-BK3 to generate a first logic operation result corresponding to each bank.

Step 608: The logic operation circuit 206 executes the second logic operation on 4 first logic operation results to generate a second logic operation result SLOR corresponding to the memory chip 210.

Step 610: The judgment unit 208 determines whether the memory chip 210 is passed according to the second logic operation result SLOR.

Step 612: End.

In Step 602, the pattern generator 202 utilizes the solid pattern, the checkerboard pattern, the row bar pattern, or the column bar pattern to write the logic voltage LV to the at least one bank of the 4 banks BK0-BK3, and writes the logic voltage LVB opposite to the logic voltage LV to other banks of the 4 banks BK0-BK3 simultaneously. Therefore, as shown in FIG. 3G, the pattern generator 202 utilizes the solid pattern, the checkerboard pattern, the row bar pattern, or the column bar pattern to write the logic voltage LV ("D0") to the banks BK0, BK2, and BK3 simultaneously, and to write the logic voltage LVB ("D0B") to the bank BK1. In addition, subsequent operational principles of FIG. 3H, FIG. 3I, FIG. 3J, FIG. 3K, and FIG. 3L are the same as those of FIG. 3G, so further description thereof is omitted for simplicity.

To sum up, the device for increasing the chip testing efficiency and method thereof not only reduce time for testing the memory chip but also provide a variety of test patterns for the memory chip. Therefore, compared to the prior art, diversity and test coverage of test patterns provided by the present invention are higher.

Those skilled in the art will readily observe that numerous modifications and alterations of the device and method may be made while retaining the teachings of the invention.

What is claimed is:

1. A method of increasing chip testing efficiency, the method comprising:
utilizing a pattern generator to write a first logic voltage to at least one first bank of a plurality of first banks of a memory chip, and to write a logic voltage opposite to the first logic voltage to other first banks simultaneously;
utilizing the pattern generator to write a second logic voltage to a plurality of second banks of the memory chip simultaneously;
utilizing a reading unit to read logic voltages stored in all memory cells of each bank of the memory chip;
utilizing a logic operation circuit to execute a first logic operation on the logic voltages stored in all the memory cells of each bank to generate a plurality of first logic operation results corresponding to each bank; and
utilizing the logic operation circuit to execute a second logic operation on the plurality of first logic operation results to generate a second logic operation result corresponding to the memory chip.

2. The method of claim 1, wherein the pattern generator utilizes a solid pattern, a checkerboard pattern, a row bar pattern, or a column bar pattern to write the first logic voltage to the at least one first bank of the plurality of first banks of the memory chip, and to write the logic voltage opposite to the first logic voltage to other first banks.

3. The method of claim 1, wherein the pattern generator utilizes a solid pattern, a checkerboard pattern, a row bar pattern, or a column bar pattern to write the second logic voltage to the plurality of second banks of the memory chip.

4. The method of claim 1, further comprising:
a judgment unit determining whether the memory chip is passed according to the second logic operation result.

5. The method of claim 1, wherein the first logic operation and the second logic operation are exclusive-OR logic operations.

6. A method of increasing chip testing efficiency, the method comprising:
utilizing a pattern generator to write a first logic voltage to at least one first bank of a plurality of first banks of a memory chip, and to write a logic voltage opposite to the first logic voltage to other first banks simultaneously;
utilizing the pattern generator to write a second logic voltage to at least one second bank of a plurality of second banks of the memory chip, and to write a logic voltage opposite to the second logic voltage to other second banks simultaneously;
utilizing a reading unit to read logic voltages stored in all memory cells of each bank of the memory chip;
utilizing a logic operation circuit to execute a first logic operation on the logic voltages stored in all the memory cells of each bank to generate a plurality of first logic operation results corresponding to each bank; and
utilizing the logic operation circuit to execute a second logic operation on the plurality of first logic operation results to generate a second logic operation result corresponding to the memory chip.

7. The method of claim 6, wherein the pattern generator utilizes a solid pattern, a checkerboard pattern, a row bar pattern, or a column bar pattern to write the first logic voltage to the at least one first bank of the plurality of first banks of the memory chip, and to write the logic voltage opposite to the first logic voltage to other first banks.

8. The method of claim 6, wherein the pattern generator utilizes a solid pattern, a checkerboard pattern, a row bar pattern, or a column bar pattern to write the second logic voltage to the at least one second bank of the plurality of second banks of the memory chip, and to write the logic voltage opposite to the second logic voltage to other second banks.

9. The method of claim 6, further comprising:
a judgment unit determining whether the memory chip is passed according to the second logic operation result.

10. The method of claim 6, wherein the first logic operation and the second logic operation are exclusive-OR logic operations.

11. A method of increasing chip testing efficiency, the method comprising:
utilizing a pattern generator to write a first logic voltage to at least one bank of a plurality of banks of a memory chip, and to write a logic voltage opposite to the first logic voltage to other banks of the plurality of banks simultaneously;
utilizing a reading unit to read logic voltages stored in all memory cells of each bank of the memory chip;
utilizing a logic operation circuit to execute a first logic operation on the logic voltages stored in all the memory cells of each bank to generate a plurality of first logic operation results corresponding to each bank; and
utilizing the logic operation circuit to execute a second logic operation on the plurality of first logic operation results to generate a second logic operation result corresponding to the memory chip.

12. The method of claim 11, wherein the pattern generator utilizes a solid pattern, a checkerboard pattern, a row bar pattern, or a column bar pattern to write the first logic voltage to the at least one bank of the plurality of banks of the memory chip, and to write the logic voltage opposite to the first logic voltage to other banks of the plurality of banks.

13. The method of claim 11, further comprising:
a judgment unit determining whether the memory chip is passed according to the second logic operation result.

14. The method of claim 11, wherein the first logic operation and the second logic operation are exclusive-OR logic operations.

15. A device for increasing chip testing efficiency, the device comprising:
a pattern generator for writing a logic voltage to each bank of a memory chip;
a reading unit for reading logic voltages stored in all memory cells of each bank of the memory chip;
a logic operation circuit for executing a first logic operation on the logic voltages stored in all the memory cells of each bank to generate a plurality of first logic operation results corresponding to each bank, and executing a second logic operation on the plurality of first logic operation results to generate a second logic operation result corresponding to the memory chip; and
a judgment unit for determining whether the memory chip is passed according to the second logic operation result.

16. The device of claim 15, wherein the pattern generator utilizes a solid pattern, a checkerboard pattern, a row bar pattern, or a column bar pattern to write the logic voltage to all the memory cells of each bank of the memory chip.

17. The device of claim 15, wherein the logic operation circuit comprises:
a first logic operation unit for executing the first logic operation on the logic voltages stored in all the memory cells of each bank read by the reading unit to generate the plurality of first logic operation results; and
a second logic operation unit for executing the second logic operation on the plurality of first logic operation results to generate the second logic operation result.

18. The device of claim 15, wherein the first logic operation and the second logic operation are exclusive-OR logic operations.

19. The device of claim 15, wherein the pattern generator writes a first logic voltage to at least one first bank of a plurality of first banks of the memory chip, writes a logic voltage opposite to the first logic voltage to other first banks simultaneously, and writes a second logic voltage to a plurality of second banks of the memory chip simultaneously.

20. The device of claim 15, wherein the pattern generator writes a first logic voltage to at least one first bank of a plurality of first banks of the memory chip, writes a logic voltage opposite to the first logic voltage to other first banks simultaneously, writes a second logic voltage to at least one second bank of a plurality of second banks of the memory chip, and writes a logic voltage opposite to the second logic voltage to other second banks simultaneously.

21. The device of claim 15, wherein the pattern generator writes a first logic voltage to at least one bank of a plurality of banks of the memory chip and writes a logic voltage opposite to the first logic voltage to other banks of the plurality of banks simultaneously.

* * * * *